United States Patent
Yamase et al.

(10) Patent No.: US 7,663,394 B2
(45) Date of Patent: Feb. 16, 2010

(54) START SIGNAL DETECTOR CIRCUIT

(75) Inventors: Tomoyuki Yamase, Tokyo (JP); Tadashi Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 59 days.

(21) Appl. No.: 12/162,148

(22) PCT Filed: Jan. 11, 2007

(86) PCT No.: PCT/JP2007/050191

§ 371 (c)(1),
(2), (4) Date: Jul. 25, 2008

(87) PCT Pub. No.: WO2007/086255

PCT Pub. Date: Aug. 2, 2007

(65) Prior Publication Data

US 2009/0010034 A1    Jan. 8, 2009

(30) Foreign Application Priority Data

Jan. 25, 2006  (JP) .............................. 2006-015865

(51) Int. Cl.
*G01R 31/26* (2006.01)
(52) U.S. Cl. ...................... 324/767; 324/520
(58) Field of Classification Search .............. 324/158.1, 324/520–521, 674, 681, 763–765; 327/39–47
See application file for complete search history.

(56) References Cited

U.S. PATENT DOCUMENTS 6,429,638 B1 * 8/2002 Wight et al. ............. 324/103 P 2007/0063708 A1 * 3/2007 Baker ......................... 324/512

FOREIGN PATENT DOCUMENTS

| JP | 60-144009 | 7/1985 |
|---|---|---|
| JP | 2004-194301 | 7/2004 |
| JP | 2004-328061 | 11/2004 |
| JP | 2006-319549 | 11/2006 |

OTHER PUBLICATIONS

F. Dickson, "On-chip high-voltage generation in MNOS integrated circuits using an inproved voltage multiplier technique", IEEE Journal of Solid-State Circuits, 1976, vol. 11, No. 3, p. 374-378.

* cited by examiner

*Primary Examiner*—Minh N Tang
*Assistant Examiner*—Trung Q Nguyen
(74) *Attorney, Agent, or Firm*—Young & Thompson

(57) ABSTRACT

A variation of a threshold of diode-connected transistors is compensated for to maintain a constant rectification efficiency of a rectifier circuit, thereby enabling stable detection of a start signal. A constant voltage is applied to DC bias terminal 103 of cascaded half-wave voltage doubler rectifier circuits (including MOS transistors M1 to M4 and capacitors C1 to C4) forming a rectifier circuit, and a voltage equal to the sum of the constant voltage applied to DC bias terminal 103 and a variation $\Delta Vt$ of a threshold voltage of the MOS transistors is applied to DC bias terminal 104 of cascaded half-wave voltage doubler rectifier circuits (including MOS transistors M5 to M8 and capacitors C5 to C8) forming a bias circuit.

32 Claims, 5 Drawing Sheets

210 Detector/amplifier circuit
220 Determination circuit
230 Binarization circuit

START SIGNAL DETECTOR CIRCUIT

TECHNICAL FIELD

The present invention relates to a start signal detector circuit, and more particularly to a circuit which receives radio frequency signal power (RF) at a particular frequency to generate a DC potential (DC) required to intermittently operate an electronic system.

BACKGROUND ART

In recent years, a communication system, such as DSRC (Dedicated Short Range Communication) which is designed for short ranges, which is used for road-to-vehicle communication in such as ETC (Electronic Toll Collection System), a commercial car management system and the like, is classified into the optical type and the radio-wave type. The communication system is generally deemed to be available for communications in a range of several meters to several hundred meters. The specifications of this system are established by ARIB STD (Association of Radio Industries Businesses standard)-T55 Standard and STD-T75 Standard, and employs a carrier frequency in a range of 5772.5 to 5847.5 MHz for a radio communication system.

A SMART PLATE (System of Multifunctional integration of Automobiles and Roads in Transport in 21st Century PLATE) system which has been progressively developed as part of this DSRC involves an IC chip on a current number plate which records information on the number plate and information described in a car registration file, and is now under investigation as an infrastructure related to individual car information indispensable for popularizing ITS (Intelligent Transport Systems), or as a means for identifying cars in car traffic administration.

This system is targeted to be capable of operating for five years without replacing a built-in battery by detecting a start signal to intermittently operate the system. A weak signal of −60 dBm in a 5.8 GHz band is used for the start signal, and a circuit is required to stably detect such a signal.

A diode-based detector circuit is known for detection of radio frequency signals, and FIG. 1A shows a representative circuit example thereof. 101 designates an RF input terminal; 102 designates an output terminal; 105 designates a power terminal; D1, D2 designate diodes; C11, C12 designate capacitors; and R11 designates a resistor. In this circuit, during half period A of an input RF signal shown in FIG. 1B, a current flows into input terminal 101 through diode D1, and capacitor C11 is charged. In the next half period B, no current flows because diode D1 is biased in the opposite direction. In this half period, a current flows from capacitor C11 through diode D2 to charge capacitor C12. Finally, the potential on capacitor C12 increases by a charge charged in each half period. This circuit performs rectification by taking advantage of a non-linear effect of the diodes to charge each capacitor only for one-half period, so that this rectifier circuit is called a "half-wave double voltage rectifier circuit."

A start signal output circuit using such a half-wave double voltage rectifier circuit has been proposed (for example, see JP-2004-194301-A (referred to as Patent Document 1 hereinafter)). FIG. 2 is a circuit diagram of the start signal output circuit which is disclosed in Patent Document 1. This circuit generally comprises detector/amplifier circuit 210, determination circuit 220 for amplifying and binarizing a detected start signal, and binarization circuit 230, and detects and amplifies an RF signal applied from RF input terminal 101 to generate a determination output from output terminal 102.

In detector/amplifier circuit 210, a half-wave double voltage rectifier circuit comprises capacitor C21 which additionally operates for input matching; smoothing capacitor C22; and diode-connected transistors Q3, Q4, where capacitors C21, C22 and transistors Q3, Q4 correspond to capacitors C11, C12 and diodes D2, D1 in FIG. 1A. Transistors Q7, Q8 comprises a current mirror circuit, where a current of reference transistor Q7 in the current mirror circuit is determined by the resistance value of resistor R21 which is a load resistance. A differential amplifier circuit is comprised of bipolar transistors Q1, Q2 which are loaded with a MOS transistor, and its total current is made constant by the current mirror circuit. While diode-connected transistors Q5, Q6 and capacitor C23 are connected to transistor Q2 as well, symmetrically to those of transistor Q1, the signal from RF input terminal 101 is not applied to this side. Therefore, transistor Q2 is applied with a constant bias at all times as a reference signal. A base current of transistor Q1 of the differential amplifier is supplied from transistor Q3 of the half-wave double voltage rectifier circuit, and the output of the differential amplifier is supplied to determination circuit 220.

In detector/amplifier circuit 210, when no RF signal is applied, the half-wave double voltage rectifier circuit comprised of transistors Q3, Q4 and capacitors C21, C22 is identical in configuration to a bias circuit comprised of transistors Q5, Q6 and capacitor C23 for applying the reference potential of the differential amplifier. Therefore, in the case where in-plane variations of elements within a chip can be neglected, two input terminals of the differential amplifier can be applied with the same potential at all times even if the element characteristics generally fluctuate due to fluctuations in processes or even if an ambient temperature varies. Accordingly, this circuit can correctly detect even a very small signal amplitude.

In addition, a rectifier circuit having diodes connected in series at multiple stages is also known (see, for example, John F. Dickson, "On-chip high-voltage generation in MNOS integrated circuits using an improved voltage multiplier technique", IEEE Journal of Solid-State Circuits, vol. SC-11, No. 3, pp. 374-378, 1976 (referred to as Non-Patent Document 1 hereinafter)). FIG. 3 is a circuit diagram of the multi-stage connected rectifier circuit proposed in Non-Patent Document 1 (although the shown example is a six-stage connected circuit, the actual number of stages is larger than this). In FIG. 3, 102 designates an output terminal; 103 designates a DC bias terminal; 106, 107 designate clock input terminals which are applied with clocks at opposite phases to each other; D designates a diode; and C designates a capacitor. According to this circuit, a voltage increase is provided for each stage of the diode, the voltage increase being obtained by subtracting a ripple voltage due to charging and discharging of the capacitor associated with an output current and a forward voltage of the diode from an amplitude based on a clock at a diode node. In the circuit shown in FIG. 3, the diode can be replaced with a diode-connected MOS transistor. In this event, the diode forward voltage used in calculating the aforementioned voltage increase is replaced with the threshold voltage of the MOS transistor.

DISCLOSURE OF THE INVENTION

If the diode-connected MOS transistors are used for a rectifier circuit, the integration density and current consumption of the rectifier circuit can be easily manufactured and improved. However, the threshold voltage of the transistors varies because of process variations during manufacture. The variation of the threshold voltage of the transistors causes variations of the rectification efficiency with respect to the input signal level, and thus, the start signal cannot be stably detected. FIG. 4 is a graph showing the input voltage dependency of the output DC level of three stages of half-wave voltage doubler rectifier circuits using diode-connected MOS transistors in the presence of and in the absence of a variation of the threshold, which is calculated by a microwave simulator. As can be seen from the result, the rectified output significantly varies with respect to the input power in the presence of a variation of the threshold voltage.

The present invention has been devised to solve the problems with the related art described above, and an exemplary object of the present invention is to prevent a rectified output from varying even if the threshold voltage of a transistor varies, thereby enabling stable detection of a start signal.

In order to attain the object described above, a start signal detector circuit according to an exemplary aspect of the present invention includes: a rectifier circuit that includes a plurality of stages of three-terminal elements, in which each of said three-terminal elements includes a first terminal, a second terminal and a control terminal, and in which each three-terminal element has a resistance value that varies nonlinearly depending on a control voltage or a control current applied to the control terminal, the three-terminal elements being connected to each other with the second terminal of each three-terminal element connected to the first terminal of the three-terminal element in the following stage; and a bias circuit that includes a plurality of stages of three-terminal elements that have the same configuration as the three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, characterized in that a constant DC bias voltage is applied to the control terminal of the three-terminal element in the first stage of the rectifier circuit, and characterized in that a voltage equal to the sum of the DC bias voltage and a variation of a threshold voltage of the three-terminal elements is applied to the control terminal of the three-terminal element in the first stage of the bias circuit.

Furthermore, in order to attain the object described above, a start signal detector circuit according to an another exemplary aspect of the present invention includes: a rectifier circuit including a plurality of stages of three-terminal elements, in which each of the three-terminal elements includes a first terminal, a second terminal and a control terminal, and each three-terminal element has a resistance value that varies nonlinearly depending on a control voltage or a control current applied to the control terminal, the three-terminal elements being connected to each other with the second terminal of each three-terminal element connected to the first terminal of the three-terminal element in the following stage; and a bias circuit that includes a plurality of stages of three-terminal elements that have the same configuration as the three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, characterized in that a constant DC bias voltage is applied to the control terminal of the three-terminal element in the first stage of the rectifier circuit, and characterized in that a voltage equal to the sum of the DC bias voltage and a threshold voltage of the three-terminal elements is applied to the control terminal of the three-terminal element in the first stage of the bias circuit, Furthermore, in order to attain the object described above, a start signal detector circuit according to the other exemplary aspect of the present invention includes: a rectifier circuit including a plurality of stages of three-terminal elements, in which each of the three-terminal elements includes a first terminal, a second terminal and a control terminal, and in which each three-terminal element has a resistance value that varies nonlinearly depending on a control voltage or a control current applied to the control terminal, the three-terminal elements being connected to each other with the second terminal of each three-terminal element connected to the first terminal of the three-terminal element in the following stage; and a bias circuit that includes a plurality of stages of three-terminal elements that have the same configuration as the three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, characterized in that the start signal detector circuit further comprises a bias potential producing circuit including a three-terminal element that has the same configuration as the three-terminal elements and includes a first terminal, a second terminal and a control terminal connected to a power supply terminal, a first node and a second node, respectively, a first resistor connected between the first node and a grounding point, a second resistor connected between the power supply terminal and the second node and a third resistor connected between the second node and the grounding point, and potentials produced at the first node and the second node in the bias potential producing circuit are supplied to the first terminal of the three-terminal element in the first stage of the rectifier circuit and to the first terminal of the three-terminal element in the first stage of the bias circuit.

Furthermore, in order to attain the object described above, a start signal detector circuit according to the other exemplary aspect of the present invention includes: a rectifier circuit that includes a plurality of stages of three-terminal elements, in which each of the three-terminal elements includes a first terminal, a second terminal and a control terminal, and in which each three-terminal elements has a resistance value that varies nonlinearly depending on a control voltage or a control current applied to the control terminal, the three-terminal elements being connected to each other with the second terminal of each three-terminal element connected to the first terminal of the three-terminal element in the following stage; and a bias circuit that includes a plurality of stages of three-terminal elements that have the same configuration as the three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, characterized in that the start signal detector circuit further comprises a bias potential producing circuit including a fourth resistor connected between a power supply terminal and a third node, a fifth resistor connected between the third node and a fourth node, a sixth resistor connected between the fourth node and a grounding point, a seventh resistor connected between the power supply terminal and a fifth node, and a three-terminal element that has the same configuration as the three-terminal elements and that includes a first terminal and a control terminal connected to the fifth node and a second terminal connected to the fourth node, and potentials produced at the third node and the fifth node in the bias potential producing circuit are supplied to the first terminal of the three-terminal element in the first stage of the rectifier circuit and to the first terminal of the three-terminal element in the first stage of the bias circuit.

According to the present invention, the variation of the threshold voltage transferred through the bias circuit can be input to the rectifier circuit. Therefore, the variation of the threshold voltage of the transistors in the rectifier circuit can be compensated for to enable stable detection of a start signal. Therefore, even a weak start signal having a power of about −60 dBm, for example, can be stably detected so that malfunction can be prevented, and the present invention contributes to power saving of the SMART PLATE system, which is expected to be realized in the future.

DESCRIPTION OF SYMBOLS

Figure 1A:
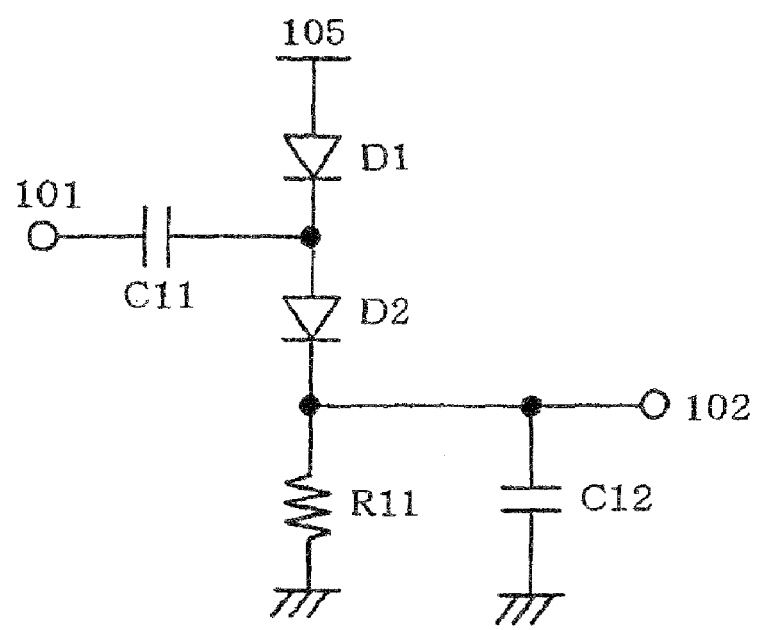
FIG. 1A is a circuit diagram showing a conventional rectifier circuit.

101 RF input terminal
102 output terminal
103, 104 DC bias terminal
105 power supply terminal
106 107 clock input terminal Best Mode for Carrying Out the Invention In the following, specific exemplary embodiments of the present invention will be described with reference to the drawings. In the following description of the exemplary embodiments, the same components will be denoted by the same reference numerals, and redundant descriptions thereof will be appropriately omitted. However, the present invention is not limited to the exemplary embodiments described below.

Exemplary Embodiment 1

Figure 5:
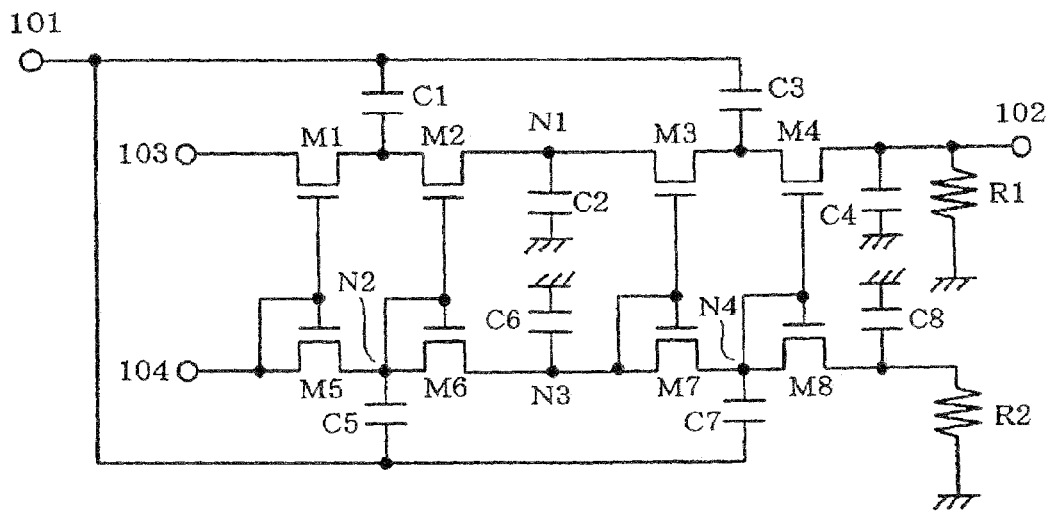
FIG. 5 is a circuit diagram showing a first exemplary embodiment of the present invention.

FIG. 5 is a circuit diagram showing a start signal detector circuit according to a first exemplary embodiment of the present invention. The start signal detector circuit according to this exemplary embodiment includes a rectifier circuit including two stages of half-wave voltage doubler rectifier circuits cascaded to each other shown in the upper part of the drawing and a bias circuit having the same configuration as the rectifier circuit shown in the lower part of the drawing. In FIG. 5, 101 denotes an RF input terminal, 102 denotes an output terminal, 103, 104 denote DC bias terminals, M1 to M8 denote MOS transistors, C1 to C8 denote capacitors, and R1, R2 denote resistors. In this circuit, a constant DC voltage is applied to DC bias terminal 103, and a voltage equal to the sum of the voltage applied to DC bias terminal 103 and the amount of a variation $\Delta Vt$ of the threshold voltage of the MOS transistors is applied to DC bias terminal 104. In the negative half cycle of a signal input to RF input terminal 101, MOS transistors M1 and M5 are conductive, and a current to charge capacitors C1 and C5 flows from DC bias terminals 103 and 104 to RF input terminal 101 through MOS transistors M1 and M5. At this time, the voltage applied to the gate of MOS transistor M1 is higher than the voltage applied to the drain thereof by the variation $\Delta Vt$ of the threshold voltage, and therefore, the effect of the variation of the threshold voltage of the transistors is cancelled, and capacitor C1 is charged by a half-wave rectified voltage that is not affected by the variation of the threshold voltage of the transistors. On the other hand, capacitor C5 is charged by a voltage equal to the sum of the bias voltage applied to DC bias terminal 104 and the half-wave rectified voltage. That is, the potential at node N2 is higher than the potential that charges capacitor C1 by the variation $\Delta Vt$ of the threshold voltage.

In the next half cycle in which the signal input to RF input terminal 101 is positive, MOS transistors M1 and M5 are nonconductive, MOS transistors M2 and M6 are conductive, and capacitors C2 and C6 are charged via MOS transistors M2 and M6. At this time, the voltage applied to the gate of MOS transistor M2 is higher than the voltage applied to the drain thereof by the variation $\Delta Vt$ of the threshold voltage, and therefore, the effect of the variation of the threshold voltage of the transistors is compensated for, and capacitor C2 is charged by a half-wave doubled voltage that is not affected by the variation of the threshold voltage of the transistors. On the other hand, capacitor C6 is charged by a voltage equal to the sum of the voltage at node N2 and the half-wave rectified voltage. That is, the potential at node N3 is higher than the potential at node N1 by the amount of the variation of the threshold voltage.

The half-wave voltage doubler rectifier circuit including MOS transistors M3 and M4 and capacitors C3 and C4 conducts the same rectifying operation as the half-wave voltage doubler rectifier circuit (M1, M2, C1, C2) in the preceding stage, and the half-wave voltage doubler rectifier circuit including MOS transistors M7 and M8 and capacitors C7 and C8 conducts the same rectifying operation as the half-wave voltage doubler rectifier circuit (M5, M6, C5, C6) in the preceding stage. That is, in the next half cycle in which the signal input to RF input terminal 101 is negative, the potential at node N3 is higher than the potential at node N1 by the amount of the variation $\Delta Vt$ of the threshold voltage of the transistors, and therefore, capacitor C3 is charged by a half-wave rectified voltage that is not affected by the variation of the threshold voltage of the transistors. On the other hand, capacitor C7 is charged by a voltage equal to the sum of the potential at node N3 and the half-wave rectified voltage. As a result, the potential at node N4 is higher than the potential that charges capacitor C3 by the amount of the variation $\Delta Vt$ of the threshold voltage. In the next half cycle in which the signal input to RF input terminal 101 is positive, capacitor C4 is charged by a half-wave doubled voltage that is not affected by the variation of the threshold voltage of the transistors. On the other hand, capacitor C8 is charged by a voltage equal to the sum of the voltage at node N4 and the half-wave doubled voltage. As a result, an output voltage equal to the sum of the voltage applied to DC bias terminal 103 and the voltage across the two stages of half-wave voltage doubler rectifier circuits is produced at output terminal 102. The output voltage is not affected by the variation of the threshold voltage of the transistors.

In this exemplary embodiment, a constant potential is applied to DC bias terminal 103, and a voltage equal to the sum of the voltage applied to DC bias terminal 103 and the amount of the variation $\Delta Vt$ of the threshold voltage of the transistors is applied to DC bias terminal 104. However, a constant potential can be applied to DC bias terminal 104. In this case, a voltage equal to the voltage applied to DC bias terminal 104 minus the variation $\Delta Vt$ of the threshold voltage of the transistors is applied to DC bias terminal 103. In this way, the rectification efficiency of the rectifier circuit can be prevented from being affected by the variation of the threshold voltage of the transistors.

Exemplary Embodiment 2

Figure 6:
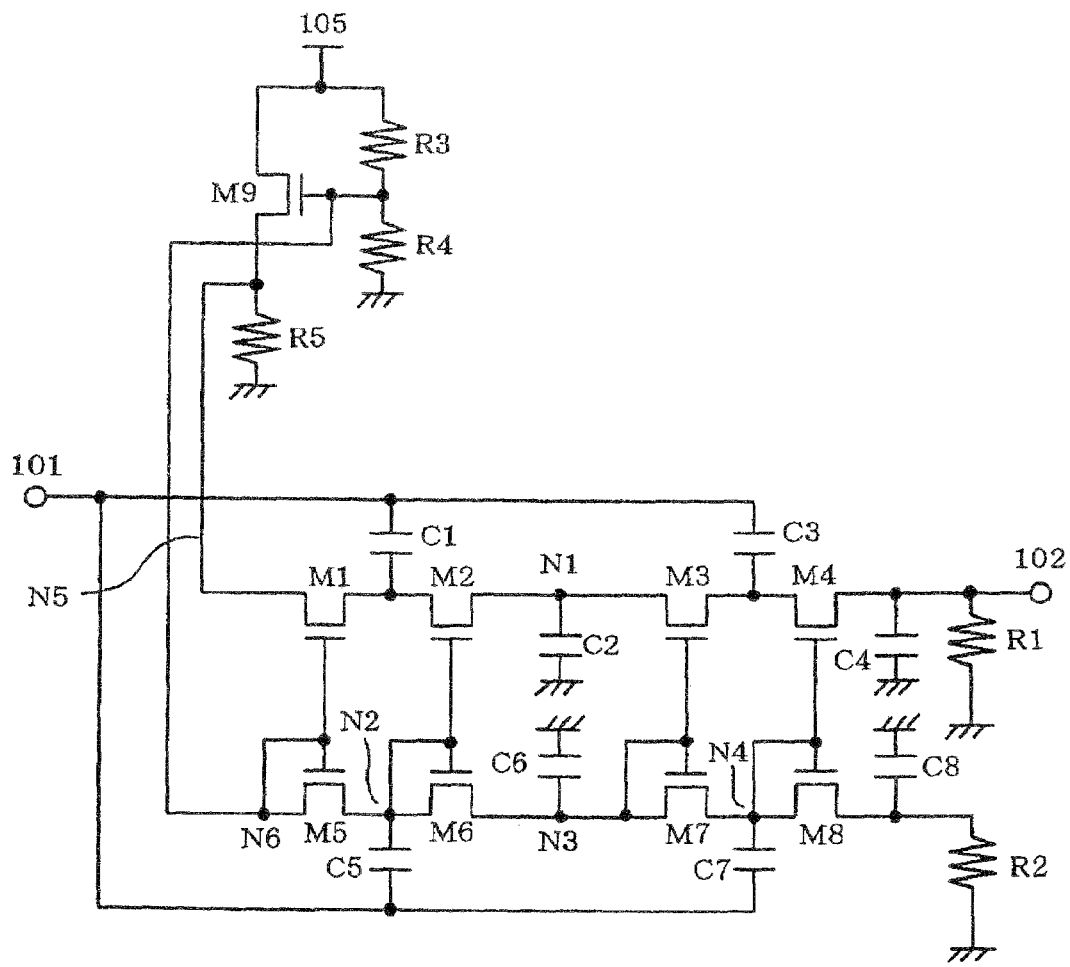
FIG. 6 is a circuit diagram showing a second exemplary embodiment of the present invention.

FIG. 6 is a circuit diagram showing a start signal detector circuit according to a second exemplary embodiment of the present invention. The start signal detector circuit according to this exemplary embodiment is the start signal detector circuit according to the first exemplary embodiment additionally provided with a circuit that produces a DC bias. In FIG. 6, 101 denotes an RF input terminal, 102 denotes an output terminal, 105 denotes a power supply terminal, M1 to M9 denote MOS transistors, C1 to C8 denote capacitors, and R1 to R5 denote resistors. The start signal detector circuit according to the second exemplary embodiment shown in FIG. 6 includes a two-stage half-wave voltage doubler rectifier circuit including MOS transistors M1 to M4 and capacitors C1 to C4, a bias circuit, which is a two-stage half-wave voltage doubler rectifier circuit including MOS transistors M5 to M8 and capacitors C5 to C8, and a circuit for detecting a threshold variation and for producing a DC bias that includes MOS transistor M9 and resistors R3 to R5. MOS transistor M9 is an MOSFET having the same size as the transistors used as nonlinear elements in the rectifier circuits. In this circuit, the potential at power supply terminal 105 is divided between resistors R3 and R4, and a constant potential is applied to node N6. The potential is applied to an input of a source follower circuit including MOS transistor M9 and resistor R5, so that a potential lower than the potential at node N6 by the sum of the threshold voltage and the voltage required for operation of the source follower can be output at node N5. The potential at node N5 can be substantially made lower than the potential at node N6 by the threshold voltage if the value of resistor R5 is set extremely high. Therefore, the potential at node N5 automatically includes a variation in the opposite direction to the variation of the threshold voltage.

Here, if it is supposed that the threshold voltage of the transistors is set at 0 V, the potential at node N5 is equal to the constant potential at node N6 minus the variation $\Delta Vt$ of the threshold voltage. In this case, a constant potential is applied to a DC bias setting terminal of the bias circuit having the same configuration as the rectifier circuit, and a potential equal to the constant potential minus the variation $\Delta Vt$ of the threshold voltage is applied to a DC bias setting terminal of the rectifier circuit. In the negative half cycle of the signal input to RF input terminal 101, MOS transistors M1 and M5 are conductive, and a current to charge capacitors C1 and C5 flows from the DC bias producing circuit to RF input terminal 101 through nodes N5 and N6 and MOS transistors M1 and M5. At this time, the voltage applied to the drain of MOS transistor M1 is lower than the voltage applied to the gate thereof by the amount of the variation $\Delta Vt$ of the threshold voltage, and therefore, the effect of the variation of the threshold voltage of the transistors is cancelled, and capacitor C1 is charged by a half-wave rectified voltage that is not affected by the variation of the threshold voltage of the transistors. On the other hand, capacitor C5 is charged by a voltage equal to the sum of the potential at node N6 and the half-wave rectified voltage. That is, the potential that charges capacitor C1 is lower than the potential at node N2 by the amount of the variation $\Delta Vt$ of the threshold voltage.

In the next half cycle in which the signal input to RF input terminal 101 is positive, MOS transistors M1 and M5 are nonconductive, MOS transistors M2 and M6 are conductive, and capacitors C2 and C6 are charged via MOS transistors M2 and M6. At this time, the voltage applied to the drain of MOS transistor M2 is lower than the voltage applied to the gate thereof by the amount of the variation $\Delta Vt$ of the threshold voltage, and therefore, the effect of the variation of the threshold voltage of the transistors is compensated for, and capacitor C2 is charged by a half-wave doubled voltage that is not affected by the amount of the variation of the threshold voltage of the transistors. On the other hand, capacitor C6 is charged by a voltage equal to the sum of the voltage at node N2 and the half-wave rectified voltage. That is, the potential at node N1 is lower than the potential at node N3 by the amount of the variation of the threshold voltage.

The half-wave voltage doubler rectifier circuit including MOS transistors M3 and M4 and capacitors C3 and C4 conducts the same rectifying operation as the half-wave voltage doubler rectifier circuit (M1, M2, C1, C2) in the preceding stage, and the half-wave voltage doubler rectifier circuit including MOS transistors M7 and M8 and capacitors C7 and C8 conducts the same rectifying operation as the half-wave voltage doubler rectifier circuit (M5, M6, C5, C6) in the preceding stage. That is, in the next half cycle in which the signal input to RF input terminal 101 is negative, the potential at node N1 is lower than the potential at node N3 by the amount of the variation $\Delta Vt$ of the threshold voltage of the transistors, and therefore, capacitor C3 is charged by a half-wave rectified voltage that is not affected by the amount of the variation of the threshold voltage of the transistors. On the other hand, capacitor C7 is charged by a voltage equal to the sum of the potential at node N3 and the half-wave rectified voltage. As a result, the potential that charges capacitor C3 is lower than the potential at node N4 by the amount of the variation $\Delta Vt$ of the threshold voltage. In the next half cycle in which the signal input to RF input terminal 101 is positive, capacitor C4 is charged by a half-wave doubled voltage that is not affected by the amount of the variation of the threshold voltage of the transistors. On the other hand, capacitor C8 is charged by a voltage equal to the sum of the voltage at node N4 and the half-wave rectified voltage. As a result, an output voltage equal to the voltage across the two stages of half-wave voltage doubler rectifier circuits that is not affected by the amount of the variation of the threshold voltage of the transistors is produced at output terminal 102.

Exemplary Embodiment 3

Figure 1B:
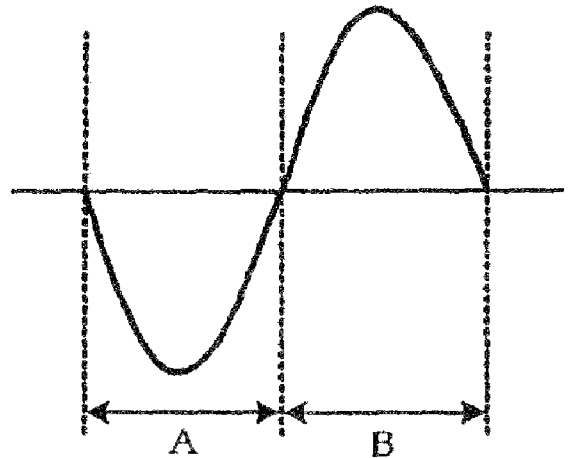
FIG. 1B is a waveform diagram for illustrating an operation principle of the rectifier circuit shown in FIG. 1A.
Figure 2:
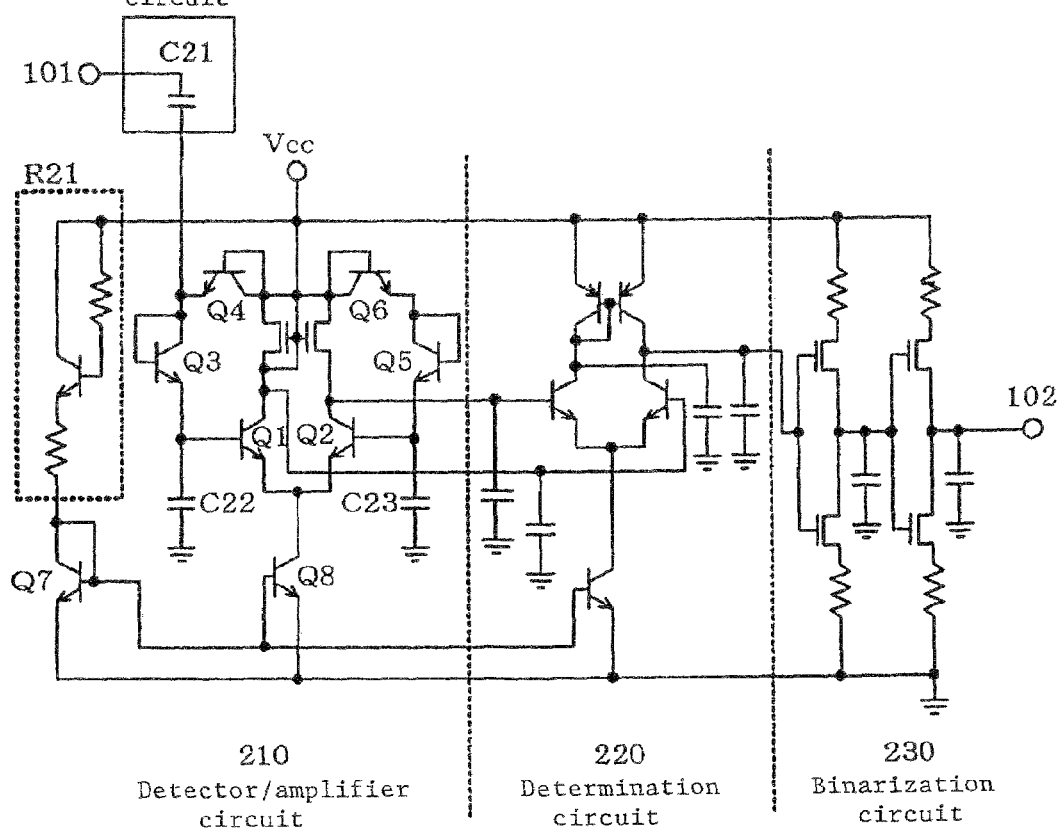
FIG. 2 is a circuit diagram showing another conventional rectifier circuit.
Figure 3:
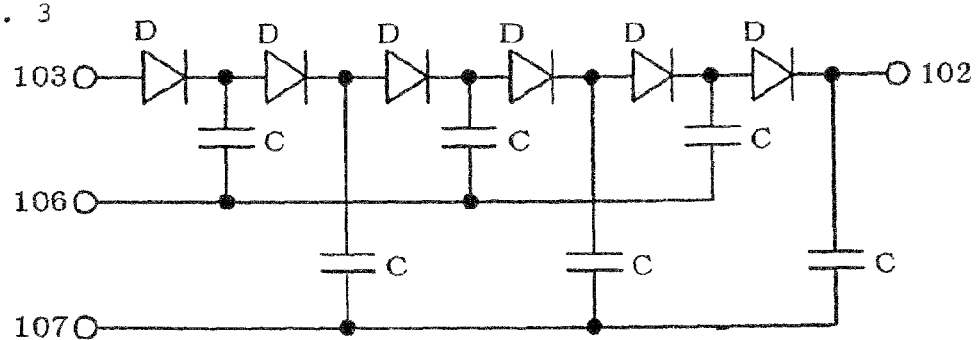
FIG. 3 is a circuit diagram showing another conventional rectifier circuit.
Figure 4:
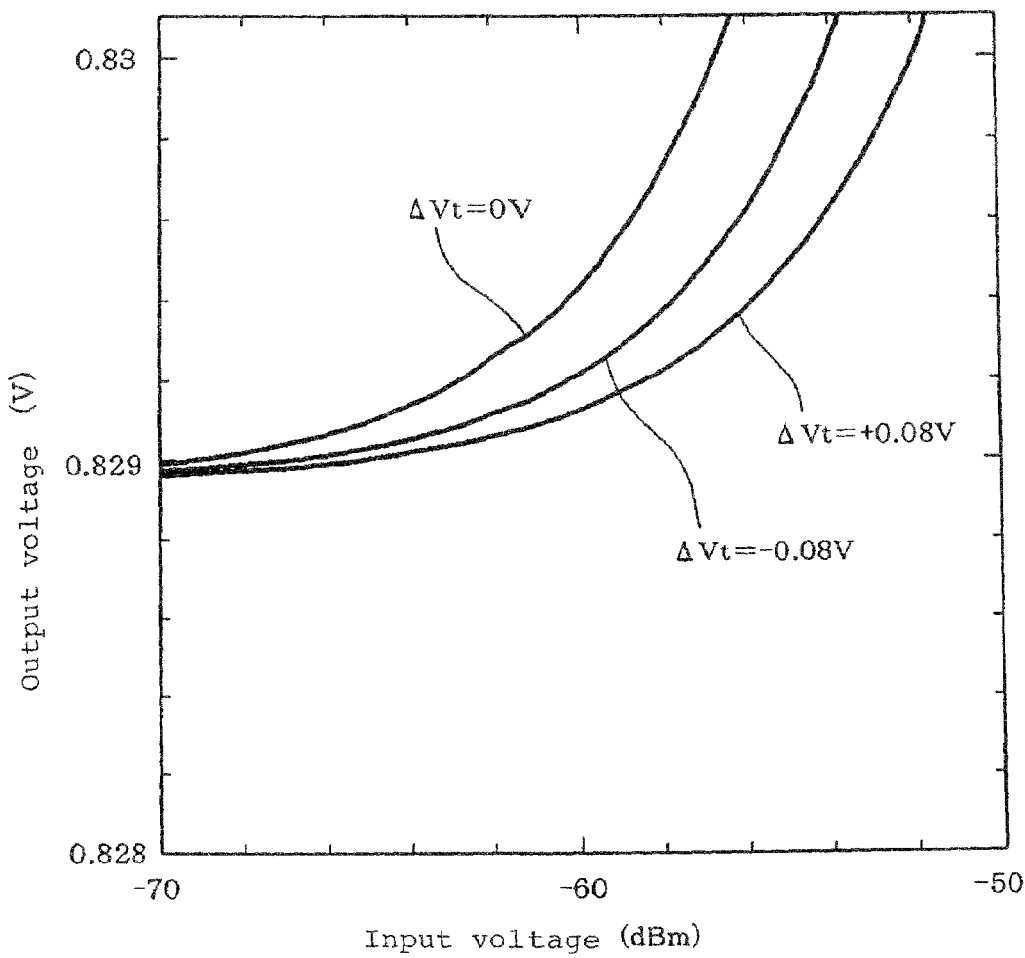
FIG. 4 is a characteristic diagram for illustrating a problem with a related art.
Figure 7:
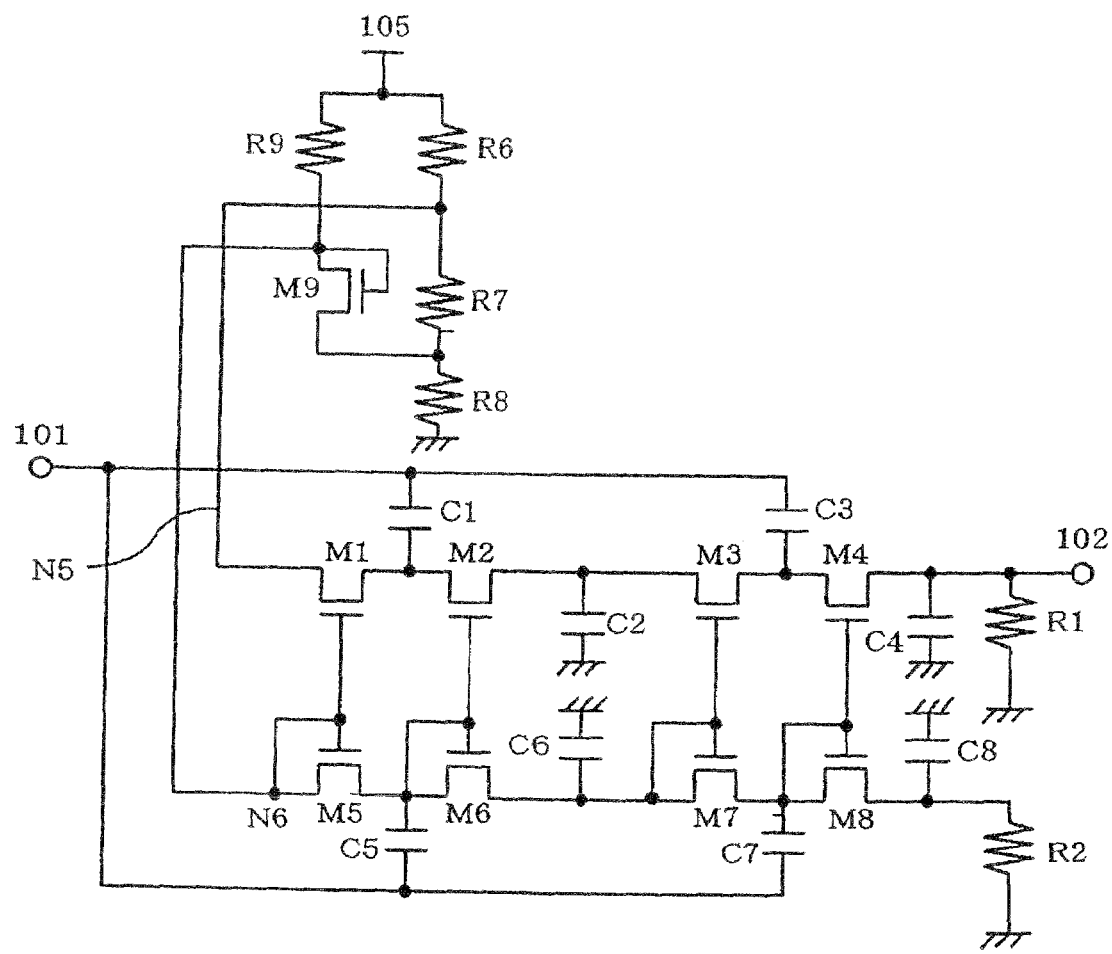
FIG. 7 is a circuit diagram showing a third exemplary embodiment of the present invention.

FIG. 7 is a circuit diagram showing a start signal detector circuit according to a third exemplary embodiment of the present invention. The start signal detector circuit according to this exemplary embodiment is the start signal detector circuit according to the first exemplary embodiment additionally provided with a circuit that produces a DC bias. In FIG. 7, 101 denotes an RF input terminal, 102 denotes an output terminal, 105 denotes a power supply terminal, M1 to M9 denote MOS transistors, C1 to C8 denote capacitors, and R1, R2, R6 to R9 denote resistors. In the start signal detector circuit according to the third exemplary embodiment shown in FIG. 7, a two-stage half-wave voltage doubler rectifier circuit including MOS transistors M1 to M4 and capacitors C1 to C4 and a bias circuit, which is a two-stage half-wave voltage doubler rectifier circuit including MOS transistors M5 to M8 and capacitors C5 to C8, conduct the same operation as the circuits according to the first exemplary embodiment shown in FIG. 1. The start signal detector circuit according to this exemplary embodiment further includes a circuit for detecting a threshold variation and producing a DC bias that includes MOS transistor M9 and resistors R6 to R9. MOS transistor M9 is an MOSFET having the same size as the transistors used as nonlinear elements in the rectifier circuits. In this circuit, the potential at power supply terminal 105 is divided among resistors R6, R7 and R8, and a constant potential is applied to node N5. A constant potential produced at the point of connection between resistors R7 and R8 is applied to the negative side of an inverter circuit including MOS transistor M9 and resistor M9, so that a potential higher than the potential at node N5 by the sum of the threshold voltage of the transistors and the voltage required for operation of the inverter can be output at node N6 which is the point of connection between resistor R9 and MOS transistor M9. Here, the potential at node N6 can be substantially made higher than the potential at node N5 by the threshold voltage if the value of resistor R8 is set extremely high. Therefore, the potential at node N6 automatically includes the variation of the threshold voltage. Here, if it is supposed that the threshold voltage of the transistors is set at 0 V, the potential at node N6 is equal to the sum of the constant potential at node N5 and the amount of the variation ΔVt of the threshold voltage. In this case, a constant potential is applied to a DC bias setting terminal of the rectifier circuit including MOS transistors M1 to M4 and capacitors C1 to C4, a potential equal to the sum of the constant potential and the amount of the variation ΔVt of the threshold voltage is applied to a DC bias setting terminal of the bias circuit including MOS transistors M5 to M8 and capacitors C5 to C8, the same operation as in the first exemplary embodiment described above occurs, and an output voltage that is not affected by the amount of the variation of the threshold voltage of the transistors can be produced at output terminal 102.

The invention claimed is:

1. A start signal detector circuit, comprising:
   a rectifier circuit that includes a plurality of stages of three-terminal elements, in which each of the three-terminal elements includes a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and
   a bias circuit that includes a plurality of stages of three-terminal elements that have the same configuration as said three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other.

2. The start signal detector circuit according to claim 1, wherein an RF input signal is applied to the second terminals of the three-terminal elements in the odd stages of the rectifier circuit and the bias circuit via a capacitor, and characterized in that the second terminals of the three-terminal elements in the even stages of the rectifier circuit and the bias circuit are grounded via a capacitor.

3. The start signal detector circuit according to claim 1, wherein said three-terminal elements are field-effect transistors.

4. The start signal detector circuit according to claim 1, wherein said three-terminal elements are bipolar transistors.

5. A start signal detector circuit, comprising:
   a rectifier circuit that includes a plurality of stages of three-terminal elements, in which each of the three-terminal elements includes a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and
   a bias circuit that includes a plurality of stages of three-terminal elements that have the same configuration as said three-terminal elements and chat are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other,
   wherein a constant DC bias voltage is applied to the first terminal of the three-terminal element in the first stage of the rectifier circuit, and a voltage equal to the sum of said DC bias voltage and an amount of a variation of a threshold voltage of the three-terminal elements is applied to the first terminal of the three-terminal element in the first stage of the bias circuit.

6. The start signal detector circuit according to claim 5, wherein an RF input signal is applied to the second terminals of the three-terminal elements in the odd stages of the rectifier circuit and the bias circuit via a capacitor, and characterized in that the second terminals of the three-terminal elements in the even stages of the rectifier circuit and the bias circuit are grounded via a capacitor.

7. The start signal detector circuit according to claim 5, wherein said three-terminal elements are field-effect transistors.

8. The start signal detector circuit according to claim 5, wherein said three-terminal elements are bipolar transistors.

9. A start signal detector circuit, comprising:
   a rectifier circuit that includes a plurality of stages of three-terminal elements, in which each of the three-terminal elements includes a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and a bias circuit that includes a plurality of stages of three-terminal elements that have the same configuration as said three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, wherein a constant DC bias voltage is applied to the first terminal of the three-terminal element in the first stage of the bias circuit, and a voltage equal to said DC bias voltage minus a variation of a threshold voltage of the three-terminal elements is applied to the first terminal of the three-terminal element in the first stage of the rectifier circuit.

10. The start signal detector circuit according to claim 9, wherein an RF input signal is applied to the second terminals of the three-terminal elements in the odd stages of the rectifier circuit and the bias circuit via a capacitor, and characterized in that the second terminals of the three-terminal elements in the even stages of the rectifier circuit and the bias circuit are grounded via a capacitor.

11. The start signal detector circuit according to claim 9, wherein said three-terminal elements are field-effect transistors.

12. The start signal detector circuit according to claim 9, wherein said three-terminal elements are bipolar transistors.

13. A start signal detector circuit, comprising:
a rectifier circuit that includes a plurality of stages of three-terminal elements, in which each of the three-terminal elements included a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and
a bias circuit that includes a plurality of stages of three-terminal elements that have the same configuration as said three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, wherein a constant DC bias voltage is applied to the first terminal of the three-terminal element in the first stage of the rectifier circuit, and a voltage equal to said DC bias voltage minus a variation of a threshold voltage of the three-terminal elements is applied to the first terminal of the three-terminal element in the first stage of the bias circuit.

14. The start signal detector circuit according to claim 13, wherein the threshold voltage of said three-terminal element is set at 0 V.

15. The start signal detector circuit according to claim 13, wherein an RF input signal is applied to the second terminals of the three-terminal elements in the odd stages of the rectifier circuit and the bias circuit via a capacitor, and characterized in that the second terminals of the three-terminal elements in the even stages of the rectifier circuit and the bias circuit are grounded via a capacitor.

16. The start signal detector circuit according to claim 13, wherein said three-terminal elements are field-effect transistors.

17. The start signal detector circuit according to claim 13, wherein said three-terminal elements are bipolar transistors.

18. A start signal detector circuit, comprising:
a rectifier circuit that includes a plurality of stages of three-terminal elements, in which each of the three-terminal elements includes a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and
a bias circuit that includes a plurality of stages of three-terminal elements that have the same configuration as said three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, wherein a constant DC bias voltage is applied to the first terminal of the three-terminal element in the first stage of the bias circuit, and a voltage equal to said DC bias voltage minus a threshold voltage of the three-terminal elements is applied to the first terminal of the three-terminal element in the first stage of the rectifier circuit.

19. The start signal detector circuit according to claim 18, wherein the threshold voltage of said three-terminal element is set at 0 V.

20. The start signal detector circuit according to claim 18, wherein an RF input signal is applied to the second terminals of the three-terminal elements in the odd stages of the rectifier circuit and the bias circuit via, a capacitor, and characterized in that the second terminals of the three-terminal elements in the even stages of the rectifier circuit and the bias circuit are grounded via a capacitor.

21. The start signal detector circuit according to claim 18, wherein said three-terminal elements are field-effect transistors.

22. The start signal detector circuit according to claim 18, wherein said three-terminal elements are bipolar transistors.

23. A start signal detector circuit, comprising:
a rectifier circuit that includes a plurality of stages of three-terminal elements, in which each of the three-terminal elements includes a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and
a bias circuit that includes a plurality of stages of three-terminal elements that have the same configuration as said three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, wherein the start signal detector circuit further comprises a bias potential producing circuit including:

a three-terminal element that has the same configuration as said three-terminal elements and that includes a first terminal, a second terminal and a control terminal connected to a power supply terminal, a first node and a second node, respectively;

a first resistor connected between the first node and a grounding point;

a second resistor connected between the power supply terminal and the second node; and a third resistor connected between the second node and the grounding point, wherein potentials produced at the first node and the second node in the bias potential producing circuit are supplied to the first terminal of the three-terminal element in the first stage of said rectifier circuit and to the first terminal of the three-terminal element in the first stage of said bias circuit.

24. The start signal detector circuit according to claim 23, wherein a threshold voltage of the three-terminal element of said bias potential producing circuit is set at 0 V.

25. The start signal detector circuit according to claim 23, wherein an RF input signal is applied to the second terminals of the three-terminal elements in the odd stages of the rectifier circuit and the bias circuit via, a capacitor, and characterized in that the second terminals of the three-terminal elements in the even stages of the rectifier circuit and the bias circuit are grounded via a capacitor.

26. The start signal detector circuit according to claim 23, wherein said three-terminal elements are field-effect transistors.

27. The start signal detector circuit according to claim 23, wherein said three-terminal elements are bipolar transistors.

28. A start signal detector circuit, comprising:

a rectifier circuit that includes a plurality of stages of three-terminal elements, in which each of the three-terminal elements includes a first terminal, a second terminal and a control terminal, and in which each three-terminal element has a resistance value that varies nonlinearly in response to a control voltage or to a control current applied to said control terminal, the three-terminal elements being connected to each other with the second terminal of each three-terminal element connected to the first terminal of the three-terminal element in the following stage; and a bias circuit that includes a plurality of stages of three-terminal elements that have the same configuration as said three-terminal elements and that are connected to each other with the second terminal of each three-terminal element connected to the first terminal of the three-terminal element in the following stage, the control terminals of the rectifier circuit and the bias circuit in the same stage being connected to each other, and the first terminals and the control terminals of the three-terminal elements in the bias circuit being connected to each other, wherein the start signal detector circuit further comprises a bias potential producing circuit including:

a fourth resistor connected between a power supply terminal and a third node, a fifth resistor connected between the third node and a fourth node, a sixth resistor connected between the fourth node and a grounding point, a seventh resistor connected between the power supply terminal and a fifth node; and a three-terminal element that has the same configuration as said three-terminal elements and includes a first terminal and a control terminal connected to the fifth node and a second terminal connected to said fourth node, wherein potentials produced at the third node and the fifth node in the bias potential producing circuit are supplied to the first terminal of the three-terminal element in the first stage of said rectifier circuit and to the first terminal of the three-terminal element in the first stage of said bias circuit.

29. The start signal detector circuit according to claim 28, wherein a threshold voltage of the three-terminal element of said bias potential producing circuit is set at 0 V.

30. The start signal detector circuit according co claim 28, wherein an RF input signal is applied to the second terminals of the three-terminal elements in the odd stages of the rectifier circuit and the bias circuit via a capacitor, and characterized in that the second terminals of the three-terminal elements in the even stages of the rectifier circuit and the bias circuit are grounded via a capacitor.

31. The start signal detector circuit according to claim 28, wherein said three-terminal elements are field-effect transistors.

32. The start signal detector circuit according to claim 28, wherein said three-terminal elements are bipolar transistors.

* * * * *